(12) United States Patent
Yi et al.

(10) Patent No.: US 6,855,465 B2
(45) Date of Patent: Feb. 15, 2005

(54) COLOR FILTER SUBSTRATE AND METHOD FOR FABRICATING THE SAME

(75) Inventors: Jong-Hoon Yi, Seoul (KR); Jeong-Hyun Kim, Gyeonggi-do (KR)

(73) Assignee: LG. Philips LCD Co., Ltd., Seoul (KR)

( * ) Notice: Subject to any disclaimer, the term of this patent is extended or adjusted under 35 U.S.C. 154(b) by 106 days.

(21) Appl. No.: 10/309,159

(22) Filed: Dec. 4, 2002

(65) Prior Publication Data

US 2003/0104291 A1 Jun. 5, 2003

(30) Foreign Application Priority Data

Dec. 5, 2001 (KR) ................................. 10-2001-0076649

(51) Int. Cl.[7] ........................... G02B 5/20; G02F 1/1335
(52) U.S. Cl. ....................................................... 430/7
(58) Field of Search ............................. 430/7; 349/106, 349/110; 249/156

(56) References Cited

U.S. PATENT DOCUMENTS 5,418,094 A  *  5/1995  Sato et al. ..................... 430/7

FOREIGN PATENT DOCUMENTS

JP          5-303012 A    *  11/1993
JP       2001-091727 A    *   4/2004

OTHER PUBLICATIONS

Kazunori Hasebe et al., Development of LCD Color Filter Production System "Transer", Fujifilm Research & Development (No. 44–1999), pp. 25–32.

* cited by examiner

*Primary Examiner*—John A. McPherson
(74) *Attorney, Agent, or Firm*—Morgan Lewis & Bockius LLP

(57) ABSTRACT

A method of fabricating a color filter substrate includes forming a plurality of color filters on a substrate, wherein the color filters are spaced apart from each other by a first interval, and forming a common electrode on the substrate to cover the color filters. A photosensitive black material layer is formed on the common electrode to fill the first intervals between the color filters, and a mask is provided over the photosensitive black material layer. Light is then applied to the photosensitive black material layer from an upper side of the substrate through the mask and from a lower side of the substrate. The light-applied photosensitive black material layer is developed to form a plurality of black matrix portions within the first intervals between the color filters and to form a plurality of spacers above the color filters.

10 Claims, 8 Drawing Sheets

COLOR FILTER SUBSTRATE AND METHOD FOR FABRICATING THE SAME

The present invention claims the benefit of Korean Patent Application No. 2001-0076649 filed in Korea on Dec. 5, 2001, which is hereby incorporated by reference.

BACKGROUND OF THE INVENTION

1. Field of the Invention

The present invention relates to a color filter substrate and a method for fabricating the same, and more particularly, to a color filter substrate and a method for fabricating the same that includes spacers and a black matrix.

2. Description of the Related Art

Until recently, display devices generally employed cathode-ray tubes (CRTs). Presently, many efforts are being made to study and develop various types of flat panel displays. For instance, thin film transistor-liquid crystal displays (TFT-LCDs) have been developed as substitutions for CRTs because of their high resolution images, lightness, small thickness, compact size, and low voltage power supply requirements.

FIG. 1 illustrates a layout of a liquid crystal display (LCD) device according to the related art. In FIG. 1, the LCD device 11 includes an upper substrate 5, a lower substrate 22, and a liquid crystal material layer 14 interposed between the upper and lower substrates 5 and 22. A black matrix 6, a color filter 8, and a transparent common electrode 18 are formed on the upper substrate 15, such that the transparent common electrode 18 is formed on the color filter 8. The color filter 8 includes sub-color filters in color red (R), green (G), and blue (B), wherein the upper substrate 5 is commonly referred to as a color filter substrate. In addition, pixel regions P, pixel electrodes 17, gate lines 13, data lines 15, and switching devices T are formed on the lower substrate 22, such that the pixel electrodes 17 are formed within the pixel regions P and the switching devices T are formed at intersections of the gate and data lines 13 and 15. Moreover, the lower substrate 22 is commonly referred to as an array substrate or a thin film transistor substrate, wherein the switching devices T are arranged in a matrix configuration. The switching device T may include thin film transistors (TFTs) to switch an arrangement direction of liquid crystal molecules within the liquid crystal material layer 14. The pixel regions P are defined by the gate and data lines 13 and 15, and a transparent conductive metal, such as indium-tin-oxide (ITO) having a relatively high transmittance, is used to form the pixel electrodes 17 within the pixel regions P.

FIG. 2 illustrates steps for fabricating a thin film transistor substrate of a liquid crystal display device according to the related art. In FIG. 2, at step st1, a thin film transistor substrate is prepared by forming an array of thin film transistors and pixel electrodes on a lower substrate. At step st2, an orientation layer is formed on the lower substrate by depositing a polymeric material thin film on an entire surface of the lower substrate, and performing a uniform rubbing process. Generally, an organic material, such as polyimide, is used as the polymeric material thin film for forming the orientation film. During the rubbing process, the orientation layer is rubbed with a cloth along one direction, thereby aligning the liquid crystal molecules within a liquid crystal material layer (to be inserted later) along an initial array orientation corresponding to the rubbing direction, thereby providing normal operation of the liquid crystal molecules and uniform display characteristics.

At step st3, a seal pattern is formed through a printing process. The print process includes forming a desired pattern by screen-printing a thermosetting plastic material. The seal pattern serves two functions: forming a gap for a subsequent liquid crystal material injection process and providing confinement of the liquid crystal material.

At step st4, spacers are formed through a spraying process. The spacers maintain a precise and uniform gap between the lower substrate and an upper substrate, wherein the size of the spacers determines the dimension of the gap. Accordingly, the spacers are sprayed evenly onto one of the upper and lower substrates. Two different types of spraying process can be employed. First, a wet spraying process sprays a mixture of alcohol and a spacer material. In addition, a dry spraying process sprays only a spacer material. Moreover, the dry spraying process involves an electrostatic spray procedure that uses electrostatic forces or a non-electric spraying procedure that uses gas pressures. The non-electric spraying procedure is generally used when static electricity can damage the liquid crystal structure, and the procedure include electrifying a predetermined amount of spacer particle by friction through pipes, and releasing the spacer particle from a nozzle to the substrate. In addition, the electrostatic spraying procedure generally includes releasing a spacer particle from a high-voltage-applied nozzle to an grounded substrate.

At step st5, an attachment of the upper substrate (color filter substrate) and the lower substrate (thin film transistor substrate) is made through an attaching process. The margin of accuracy for attaching and aligning the upper and lower substrates is determined based on the design of each substrate. In general, accuracy within a few micrometers ($\mu m$) is required. If the accuracy of the alignment is not within the margin, the liquid crystal material layer will not properly operate due to light leakage.

At step st6, a cutting process of the liquid crystal cell is performed to create individual unit cells. For example, a number of individual unit cells are formed on one large-sized glass substrate, and the large-sized substrate is subsequently divided into the individual unit cells through the cutting process. Although the cutting process can be performed after the liquid crystal material is injected, the liquid crystal material is commonly injected into the individual unit cells because the size of the large-sized substrate. The cutting process includes a scribing process that forms cutting lines on a surface of the large-size substrate using a diamond pen, and a breaking process that divides the substrate along the cutting lines by application of force.

At step st7, the liquid crystal material is injected between the upper and lower substrates of each individual unit through a injection process. Typically, each of the individual unit cells has a size of several hundreds of square centimeters with a gap of several micrometers between the upper and lower substrates. Accordingly, a vacuum injection procedure is commonly used.

Alternatively, spacers can be formed through a patterning process, rather than the spraying process. For example, the patterning of spacers may be performed on the lower substrate (the thin film transistor substrate) over the matrix structure, or the patterning of spacers may be performed on the upper substrate (the color filter substrate) by using a photosensitive material.

FIGS. 3A–3G illustrate a method of forming a color filter substrate of a liquid crystal display device according to the related art. In FIG. 3A, a photosensitive black organic material is deposited on a transparent insulating substrate 5, thereby forming a black organic layer 4. The photosensitive black organic material can be a positive type where portions that are subsequently exposed to light are removed by a development process, or a negative type, such that portions that are subsequently exposed to light are not removed by a development process. In addition, a mask 19 having light-transmitting portions A and light-shielding portions B is disposed over the black organic layer 4. Subsequently, light L1 irradiates portions of the black organic layer 4 through the light-transmitting portions A of the mask 19. In FIG. 3B, after developing the light-exposed black organic layer 4, a black matrix 6 is formed on the transparent insulating substrate 5. Generally, the black matrix 6 is formed between red/green/blue patterns (sub-color filters) to screen light along a boundary of pixel electrodes 17 (in FIG. 1). The black matrix 6 is commonly formed of a metal thin film, such as chromium (Cr), a carbon-based organic material having an optical density of more than 3.5, or a double layer structure of Cr and chromium-oxide ($CrO_x$), to form a uniform lower reflection layer. The specific material used for forming the black matrix 6 is commonly based on the material availability.

In FIG. 3C, a color filter using a color resin of red (R), green (G), and blue (B) is formed on the substrate 5 and the black matrix 6. The color resin includes a photo polymerization initiation material, a photo polymerization type photosensitive composition material, and an organic pigment that has red/green/blue or similar colors. For example, a red color resin is first deposited on an entire surface of the substrate 5, and a red sub-color filter 8a is formed within a desired region by selective exposure of light. Next, a green color resin is deposited on the entire surface of the substrate 5, and a green color filter 8b is formed by another selective exposure of light. Then, a blue color resin is deposited on the entire surface of the substrate 5, and a blue color filter 8c is within a desired region by another selective exposure of light. Although the above-discussed sequence of the color resin is red, green, blue, any sequence of color resin may be chosen. Accordingly, the substrate 5 can now be referred to as a color filter substrate.

In FIG. 3D, after sub-color filters 8a, 8b, and 8c are formed on the substrate 5 and the black matrix 6, a planarization process is performed. The planarization process includes depositing a transparent resin having insulating properties on the color filter substrate 5 to form an overcoat layer 26.

In FIG. 3E, a process of forming an electrode on the color filter substrate 5 is performed. In general, when using the color filter substrate 5 as the upper substrate of the liquid crystal display panel, a transparent electrode 18 is formed on top of the color filter substrate 5. The transparent electrode 18 (i.e., the common electrode) will be used to drive the liquid crystal material layer 14 (in FIG. 1) with a pixel voltage. The common electrode 18 is formed by depositing a transparent conductive material, such as indium-tin oxide (ITO) or indium-zinc-oxide (IZO), on the overcoat layer 26, and subsequent patterning of the transparent conductive material. Moreover, an organic material, such as polyimide, is deposited on the common electrode 18, and rubbed to form an alignment layer 19.

In FIG. 3F, patterning is performed to form spacers. First, a photosensitive organic material is coated on the entire surface of the alignment layer 19 to form a photosensitive organic layer 28, such that the photosensitive organic material is a negative type that leaves the light-exposure portions after a development process. A mask 30 having light-transmitting portions E and light-shielding portions F is disposed over the photosensitive organic layer 28, such that the light-transmitting portions E correspond to the areas where the desired spacer patterns will be subsequently formed. Then, light L2 irradiates the photosensitive organic layer 28 through the light-transmitting portions E of the mask 30. In FIG. 3G, after a development process is completed, the photosensitive organic layer 28 is developed into spacer patterns 40.

The aforementioned process, however, has some disadvantages. For example, a number of the steps (the photolithographic process) are required to form only spacers, whereby the photolithographic process is more complicated than the spraying method. Further, an additional mask is required to form the spacers during the photolithographic process, thereby increasing production cost.

SUMMARY OF THE INVENTION

Accordingly, the present invention is directed to a color filter substrate and a method for fabricating the same that substantially obviates one or more of the problems due to limitations and disadvantages of the related art.

An object of the present invention is to simplify a fabrication process of a liquid crystal display panel to improve the quality of the liquid crystal display panel by using a double-exposure for spacer fabrication.

Another object of the present invention is to provide a method of forming a color filter substrate with an improved fabrication process.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of fabricating a color filter substrate includes forming a plurality of color filters on a substrate, wherein the plurality of color filters are spaced apart from each other by a first interval, forming a common electrode on an entire surface of the substrate to cover the plurality of color filters, forming a photosensitive black material layer on an entire surface of the common electrode to substantially fill the first intervals between the plurality of color filters, providing a mask over the photosensitive black material layer, the mask has a plurality of light-transmitting portions and light-shielding portions, applying light to the photosensitive black material layer from an upper side of the substrate through the mask, applying light to the photosensitive black material layer from a lower side of the substrate, developing the light-applied photosensitive black material layer to form a plurality of black matrix portions within the first intervals between the plurality of color filters and to form a plurality of spacers above the color filters, and forming an orientation film over the entire surface of the substrate to cover the plurality of spacers, the plurality of black matrix portions and exposed portions of the common electrode.

In another aspect, a color filter substrate device includes a substrate, a plurality of color filters formed on the substrate spaced apart from each other at a first interval, a common electrode formed an entire surface of the substrate covering the plurality of color filters, a plurality of black matrix portions formed on the common electrode within the first interval areas between the plurality of color filters, a plurality of spacers formed on the common electrode above the plurality of color filters, and an orientation film over the entire surface of the substrate covering the plurality of spacers, the plurality of black matrix portions and exposed portions of the common electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
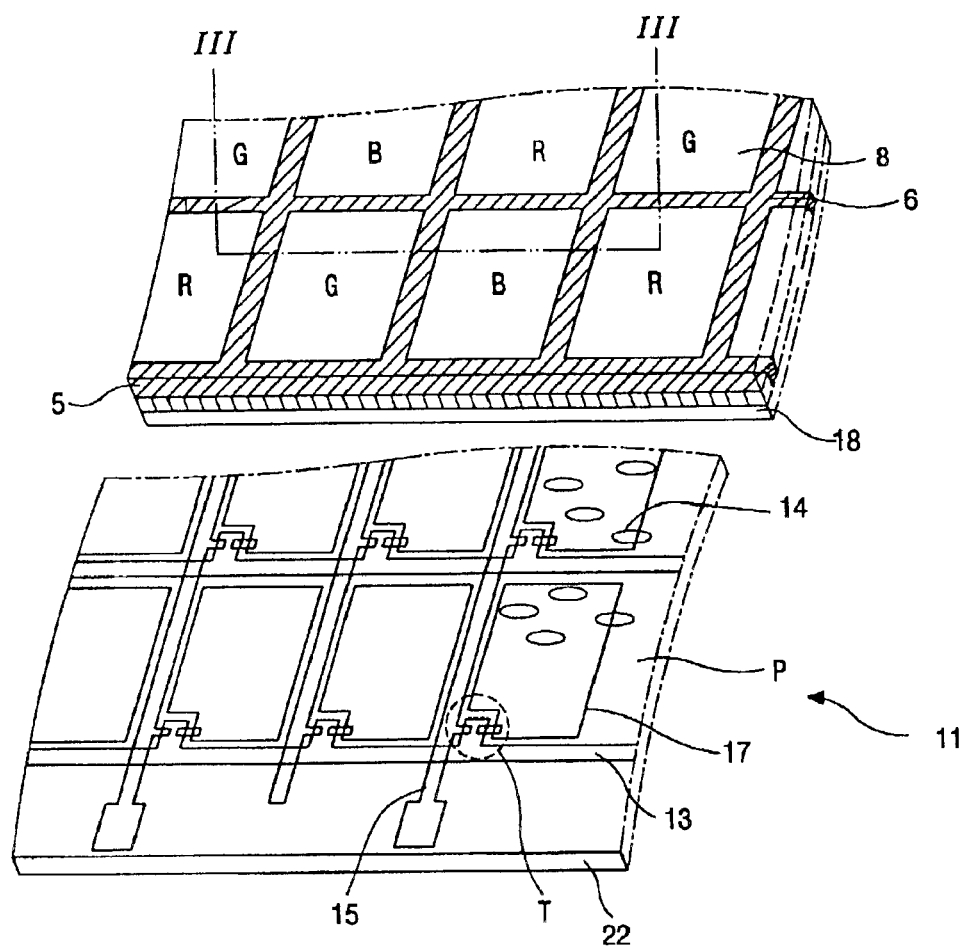
FIG. 1 illustrates a layout of a liquid crystal display device according to the related art.
Figure 2:
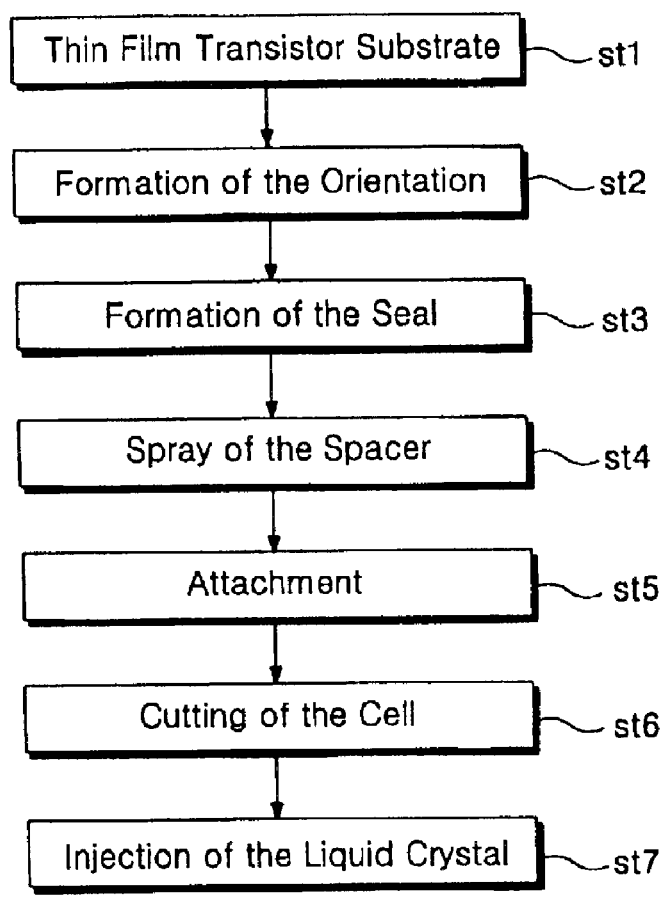
FIG. 2 illustrates steps for fabricating a thin film transistor substrate of a liquid crystal display device according to the related art.
Figure 3A:
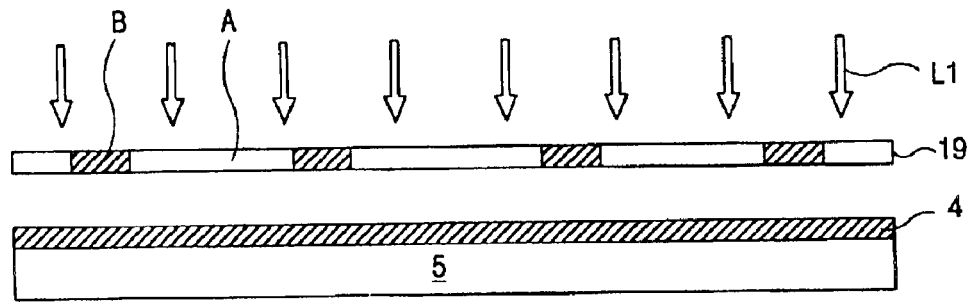
FIGS. 3A–3G illustrate a method of forming a color filter substrate of a liquid crystal display device according to the related art.
Figure 3B:
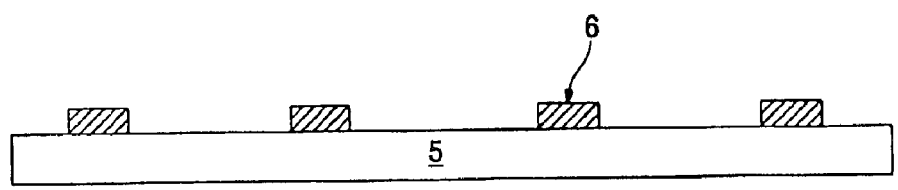
Figure 3C:
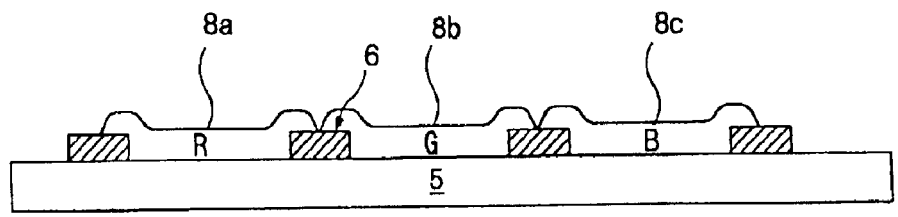
Figure 3D:
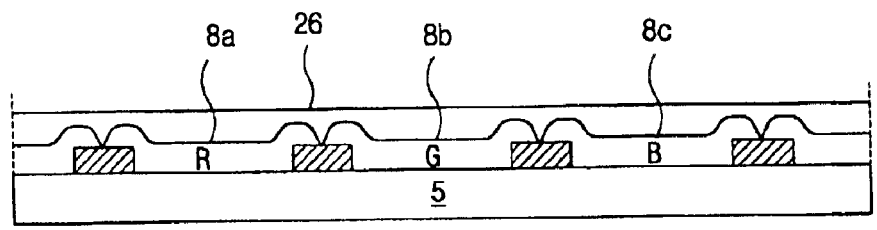
Figure 3E:
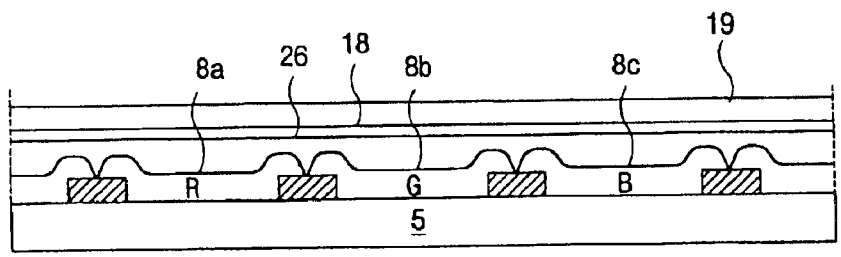
Figure 3F:
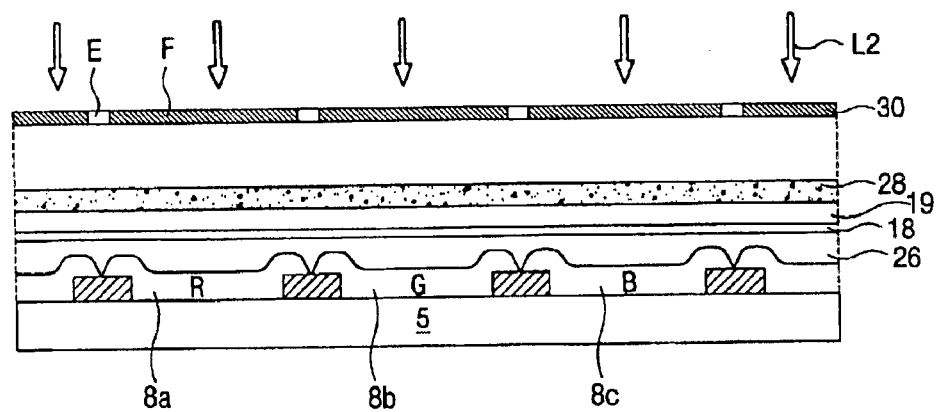
Figure 3G:
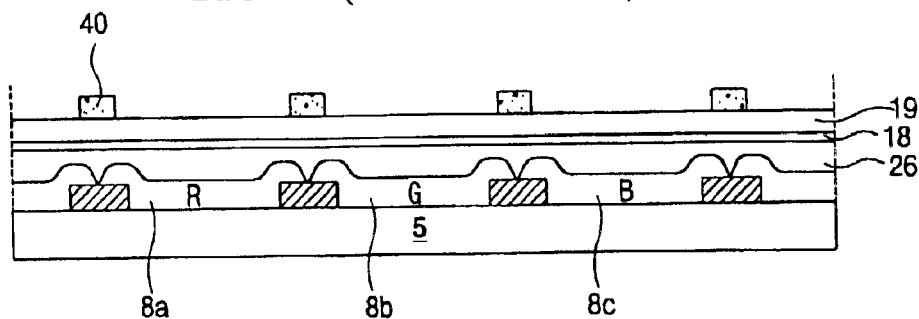
Figure 4:
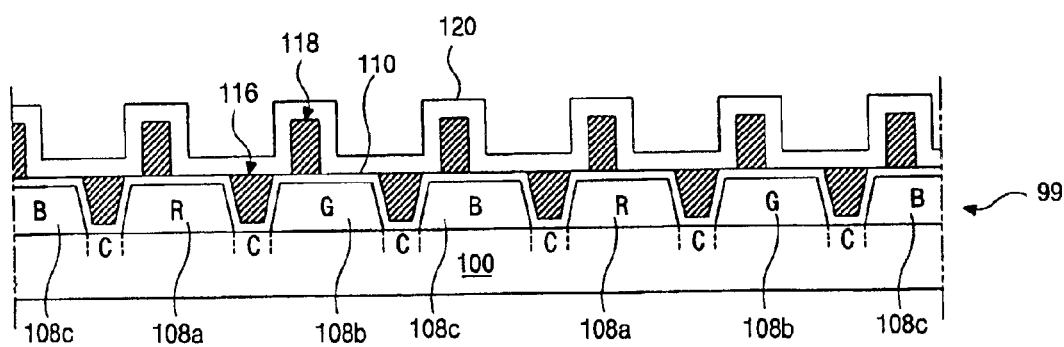
FIG. 4 illustrates a cross-sectional view of an exemplary color filter substrate of a liquid crystal display device according to the present invention.

FIG. 4 illustrates a cross-sectional view of an exemplary color filter substrate of a liquid crystal display device according to the present invention. In FIG. 4, a color filter substrate 99 may include a glass substrate 100 and a color filter layer having red (R), green (G), and blue (B) sub-color filters 108a, 108b and 108c on the glass substrate 100. A common electrode 110 may be formed on an entire surface of the glass substrate 110 and may cover the sub-color filters 108a, 108b and 108c. A plurality of black matrix portions 116 may be formed on portions of the common electrode 110 between the sub-color filters 108a, 108b, and 108c within interval areas C between sub-color filters 108a, 108b, and 108c. Moreover, the plurality of black matrix portions 116 may not directly contact the sub-color filters 108a, 108b, and 108c because the common electrode 110 may be disposed between the plurality of black matrix portions 116 and the sub-color filters 108a, 108b, and 108c. In addition, a plurality of spacer patterns 118 may be formed on exposed portions of the common electrode 110 at portions that are directly above the sub-color filters 108a, 108b, and 108c. The spacer patterns 118 may be formed of the same material as the plurality of black matrix portions 116. Further, an orientation film 120 may be disposed on the common electrode 110 to cover the spacer patterns 118 and the black matrix 116.

Figure 5A:
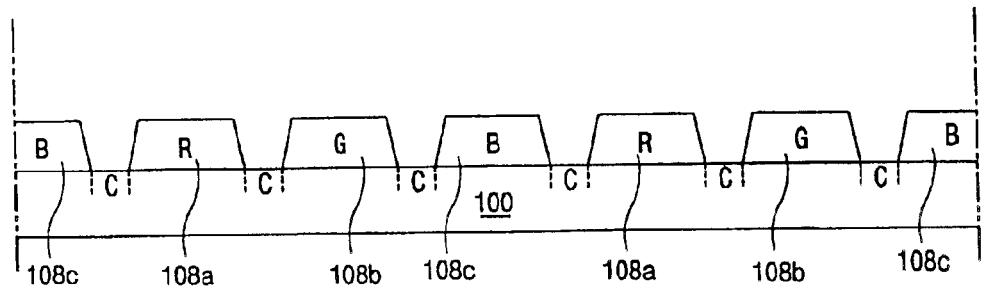
FIGS. 5A–5F illustrate a method of forming an exemplary color filter substrate of a liquid crystal display device according to the present invention.

FIGS. 5A–5F illustrate a method of forming an exemplary color filter substrate of a liquid crystal display device according to the present invention. In FIG. 5A red (R), green (G), and blue (B) sub-color filters 108a, 108b, and 108c may be formed on a transparent insulating substrate 100. For example, a color red resin may be first deposited on an entire surface of the transparent insulating substrate 100, and a red sub-color filter 108a may be formed within a desired region by selective exposure of light. Next, a green color resin may be deposited on the entire surface of the transparent insulating substrate 100, and a green color filter 108b may be formed by another selective exposure of light. Then, a blue color resin may be deposited on the entire surface of the transparent insulating substrate 100, and a blue color filter 108c may be formed within a desired region on the transparent insulating substrate 100 by another selective exposure of light. Although the above-discussed sequence of the color resin is red, green and blue, any sequence of color resin may be chosen. Moreover, the sub-color filters 108a, 108b, and 108c may be separated and spaced apart from each other, such that interval areas C may be disposed between the sub-color filters 108a, 108b, and 108c.

Figure 5B:
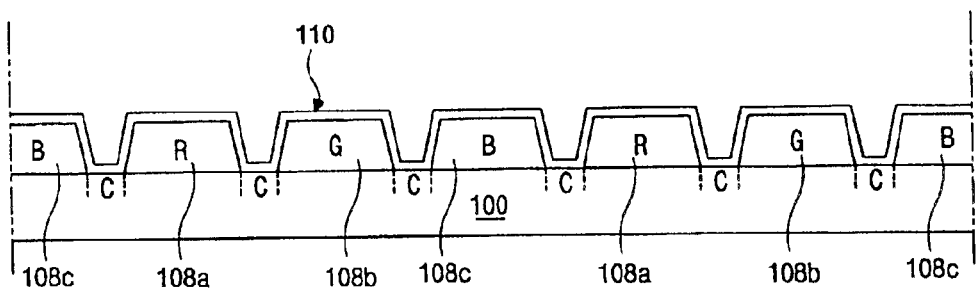

In FIG. 5B, a common electrode 110 may be formed on an entire surface of the transparent insulating substrate 100 to cover the sub-color filters 108a, 108b, and 108c. In addition, the common electrode 110 may be formed on an entire surface of the transparent insulating substrate 100 and may include a layer of material selected from a group of indium-tin-oxide (ITO) and indium-zinc-oxide (IZO).

Figure 5C:
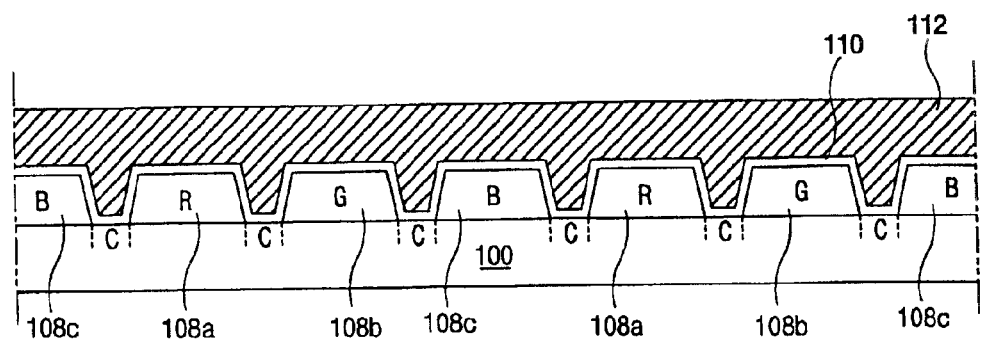

In FIG. 5C, a photosensitive black organic material 112 that is a negative type may be formed on an entire surface of the transparent insulating substrate 100 to cover the common electrode 110. The negative type black organic layer 112 may have a thickness that is at least enough to fill up the interval areas C disposed between the sub-color filters 108a, 108b, and 108c.

Figure 5D:
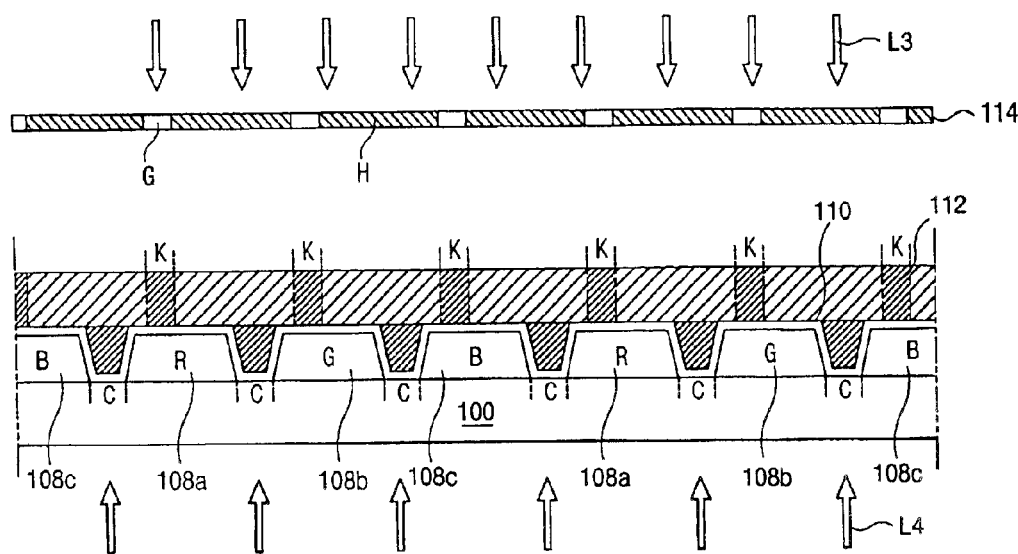

In FIG. 5D, a mask 114 having light-transmitting portions G and light-shielding portions H may be positioned over the negative type black organic layer 112 to perform a double exposure process. The double exposure process may include irradiating light L3 onto the negative type black organic layer 112 from a front side of the substrate 100 through the light-transmitting portions G, and irradiating light L4 onto the negative type black organic layer 112 from an rear side of the substrate 100. The irradiation of the lights L3 and L4 may be performed at about the same time. Moreover, portions K of the black organic layer 112 may be exposed to and react with the light L3, while portions of the black organic layer 112 located within the interval areas C disposed between the sub-color filters 108a, 108b, and 108c may be exposed to and react with the light L4.

Figure 5E:
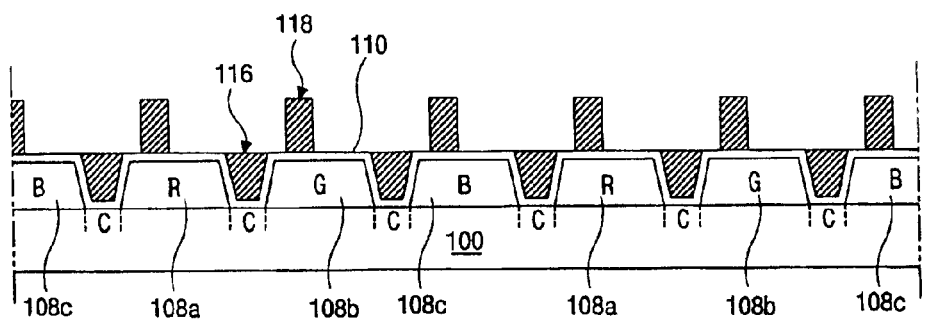

In FIG. 5E, a development process may be performed, wherein the light-exposed portions of the negative-type black organic layer 112 are not removed and remain on the substrate 100. In addition, the portions of the black organic layer 112 exposed to the irradiating light L4 may remain within the interval areas C disposed between the sub-color filters 108a, 108b, and 108c to form a plurality of black matrix portions 116. Further, the portions K of the black organic layer 112 exposed to the irradiating light L3 may remain directly above the sub-color filters 108a, 108b, and 108c to form a plurality of patterned spacers 118. Moreover, the plurality of black matrix portions 116 may surround the sub-color filters 108a, 108b, and 108c, and the plurality of patterned spacers 118 may have a pillar shape. Alternatively, the patterned spacers 118 may include other geometries such as trapezoidal, cylindrical, and triangular. In addition, each of the patterned spacers may have different geometrical shapes. Accordingly, the mask 114 (in FIG. 5D) may include a variety of differently shaped light-transmitting portions G and light-shielding portions H.

Figure 5F:
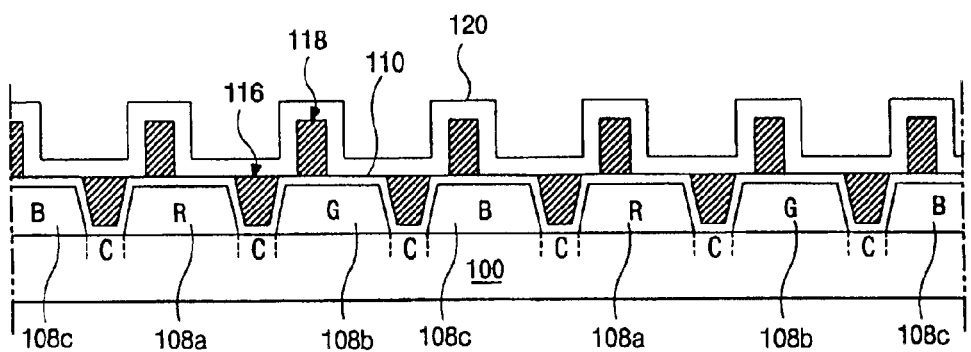

In FIG. 5F, an orientation film 120 may be formed by deposition of a material, such as polyimide or an acrylic resin, over an entire surface of the substrate 100 to cover the plurality of patterned spacers 118, the plurality of black matrix portions 116 and the common electrode 110. Subsequently, a rubbing process may be performed along a definite direction after the deposition of the material.

The above-mentioned inventive process of forming the color filter substrate has the following advantages. First, the spacers and the black matrix may be formed at about the same time. Thus, steps of forming and removing a second mask is eliminated, thereby simplifying the fabrication process. In addition, since the spacers and the black matrix are made of the same material, the cost of production can be reduced and the price competitiveness can be elevated.

It will be apparent to those skilled in the art that various modifications and variations can be made in the color filter substrate and the method for fabricating the same of the present invention without departing from the spirit or scope of the invention. Thus, it is intended that the present invention cover the modifications and variations of this invention provided they come within the scope of the appended claims and their equivalents.

What is claimed is:

1. A method of fabricating a color filter substrate, comprising the steps of:

forming a plurality of color filters on a substrate, the plurality of color filters are spaced apart from each other by a first interval;

forming a common electrode on an entire surface of the substrate to cover the plurality of color filters;

forming a photosensitive black material layer on an entire surface of the common electrode to substantially fill the first intervals between the plurality of color filters;

providing a mask over the photosensitive black material layer, the mask has a plurality of light-transmitting portions and light-shielding portions;

applying light to the photosensitive black material layer from an upper side of the substrate through the mask;

applying light to the photosensitive black material layer from a lower side of the substrate;

developing the light-applied photosensitive black material layer to form a plurality of black matrix portions within the first intervals between the plurality of color filters and to form a plurality of spacers above the color filters; and forming an orientation film over the entire surface of the substrate to cover the plurality of spacers, the plurality of black matrix portions and exposed portions of the common electrode.

2. The method according to claim 1, wherein the step of applying light from an upper side of the substrate is performed about the same time as the step of applying light from a lower side of the substrate.

3. The method according to claim 1, wherein the step of applying light from an upper side of the substrate includes a step of exposing portions of the photosensitive black material layer formed above the plurality of color filters.

4. The method according to claim 1, wherein the step of applying light from a lower side of the substrate includes a step of exposing portions of the photosensitive black material layer formed within the first intervals between the color filters.

5. The method according to claim 1, wherein the step of providing a mask over the photosensitive black material layer includes a step of providing the plurality of light-transmitting portions of the mask above the plurality of color filters.

6. The method according to claim 1, wherein the step of forming a photosensitive black material layer includes a step of forming a negative type material layer.

7. The method according to claim 6, wherein portions of the photosensitive black material layer exposed to the light are not removed by the step of developing.

8. The method according to claim 1, wherein the step of forming a photosensitive black material layer includes a step of forming a photosensitive black organic material layer.

9. The method according to claim 1, wherein the step of forming a common electrode includes a step of depositing a material includes one of indium tin oxide and indium zinc oxide.

10. The method according to claim 1, wherein the plurality of spacers include a pillar shape.

* * * * *